United States Patent
Ryu et al.

(10) Patent No.: US 10,930,346 B1
(45) Date of Patent: Feb. 23, 2021

(54) RESISTIVE MEMORY WITH SELF-TERMINATION CONTROL FUNCTION AND SELF-TERMINATION CONTROL METHOD

(71) Applicant: Winbond Electronics Corp., Taichung (TW)

(72) Inventors: Douk-Hyoun Ryu, San Jose, CA (US); Chi-Shun Lin, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/698,950

(22) Filed: Nov. 28, 2019

(51) Int. Cl.
 *G11C 13/00* (2006.01)
(52) U.S. Cl.
 CPC .. *G11C 13/0069* (2013.01); *G11C 2013/0078* (2013.01)
(58) Field of Classification Search
 None
 See application file for complete search history.

(56) References Cited

U.S. PATENT DOCUMENTS

| 10,692,575 B1 * | 6/2020 | Huang | G11C 13/0038 |
| 2016/0035403 A1 * | 2/2016 | Antonyan | G11C 11/1697 365/158 |
| 2017/0221562 A1 | 8/2017 | Buchanan | |

FOREIGN PATENT DOCUMENTS

| CN | 101783183 | 7/2010 |
| CN | 102169720 | 8/2011 |
| TW | I646531 | 1/2019 |

* cited by examiner

Primary Examiner — James G Norman
(74) Attorney, Agent, or Firm — JCIPRNET

(57) ABSTRACT

A resistive memory with a self-termination control function and a self-termination control method for a resistive memory are provided. At least one memory cell comprises a cell transistor and a resistive element. A termination switch coupled to a source line terminates a write operation according to a comparison result. The comparator compares a voltage of a source line node with a reference voltage to output the comparison result, wherein the source line node is between the at least one memory cell and the termination switch, and the voltage of the source line node responses to the resistance of the resistive element. The variable resistance circuit provides an effective resistance according to a target resistance of the resistive element and outputs a reference current. The reference voltage node is coupled to the variable resistance circuit and the comparator and receives the reference current to provide the reference voltage to the comparator.

15 Claims, 4 Drawing Sheets

RESISTIVE MEMORY WITH SELF-TERMINATION CONTROL FUNCTION AND SELF-TERMINATION CONTROL METHOD

BACKGROUND

Technical Field

The invention relates to a non-volatile memory, and particularly relates to a resistive memory with a self-termination control function and a self-termination control method.

Description of Related Art

A resistive random access memory (RRAM) is one type of non-volatile memories and owns advantages such as simple structure, large capacity, low cost, low power, and high speed. Each memory cell of a RRAM can have its binary state, the high resistance state (HRS), and the low resistance state (LRS). The write current is applied to the selected memory cell to change the state. While performing a set operation, the write current is increased by a current increment until the selected memory cell is switched from HRS to LRS. However, since the write termination timing varies due to temperature or the manufacturing process, the final low resistance of the memory cell also shifts from the target value. Therefore, how to avoid the low resistance variation and propose a stable self-termination circuit becomes an important issue of the technological development of the resistive random access memory nowadays.

SUMMARY

The invention provides a resistive memory with a self-termination control function and a self-termination control method, which can achieve accurate self-termination control independent of process, voltage, and temperature (PVT) or process corners.

A resistive memory of the invention has a self-termination control function and includes at least one memory cell, a source line control circuit, and a current reference circuit. The at least one memory cell is coupled to a bit line and a source line and comprises a cell transistor and a resistive element, wherein a resistance of the resistive element is changed during a write operation. The source line control circuit includes a termination switch and a comparator. The termination switch is coupled to the source line and terminates the write operation performing on the at least one memory cell according to a comparison result. The comparator compares a voltage of a source line node with a reference voltage to output the comparison result, wherein the source line node is on the source line and between the at least one memory cell and the termination switch, and the voltage of the source line node responses to the resistance of the resistive element. The current reference circuit includes a variable resistance circuit and a reference voltage node. The variable resistance circuit provides an effective resistance according to a target resistance of the resistive element and outputs a reference current. The reference voltage node is coupled to the variable resistance circuit and the comparator and receives the reference current to provide the reference voltage to the comparator.

A self-termination control method for a resistive memory of the invention includes the following steps: performing a write operation on a selected memory cell of the resistive memory according to a target resistance of a resistive element of the selected memory cell and generating a source line voltage correspondingly; providing an effective resistance of a dummy memory cell according to the target resistance and outputting a reference voltage based on the effective resistance, wherein the dummy memory cell is configured corresponding to the selected memory cell; comparing the source line voltage with the reference voltage to generate a comparison result; and terminating the write operation according to the comparison result.

To make the aforementioned more comprehensible, several embodiments accompanied with drawings are described in detail as follows.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
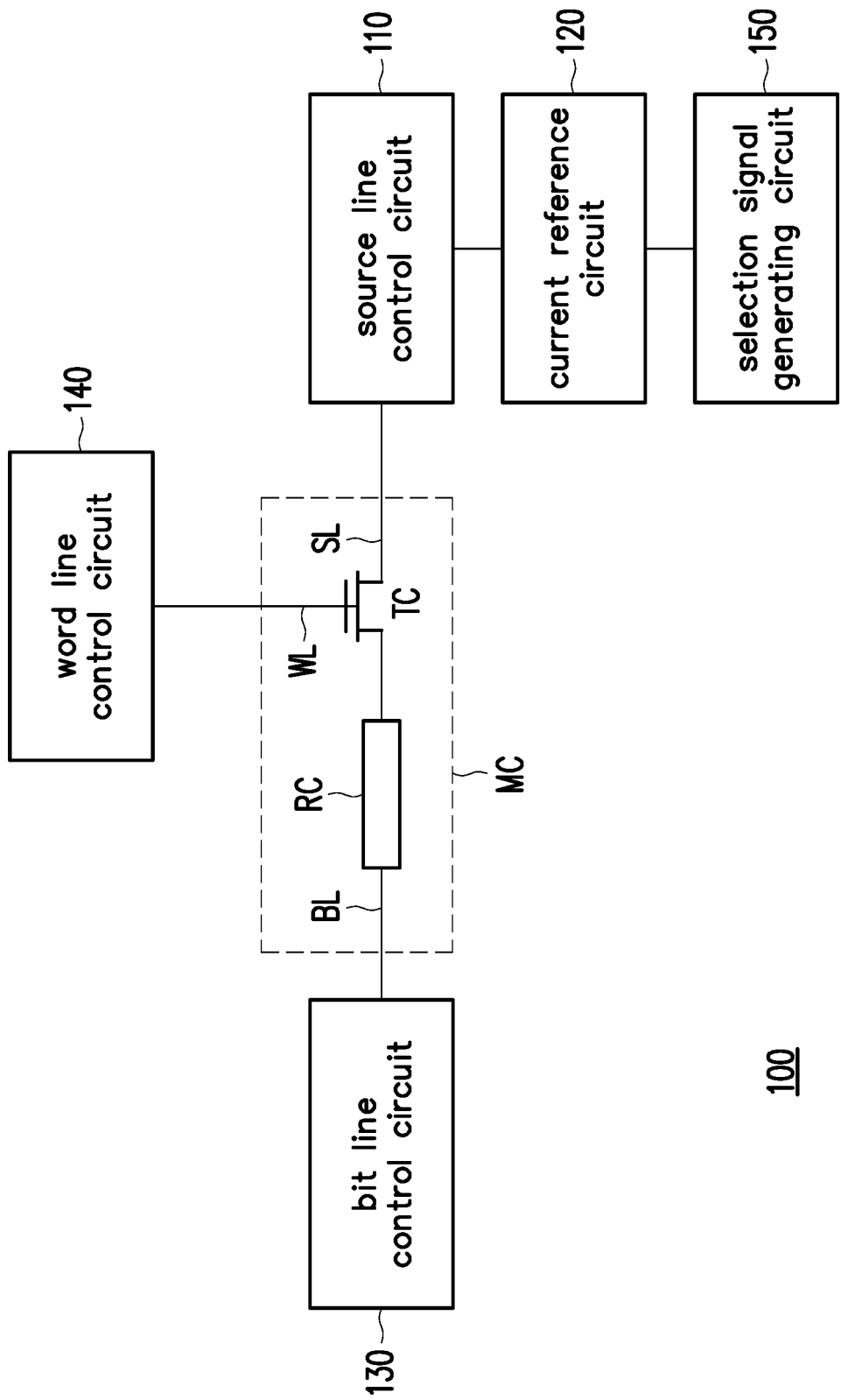
FIG. 1 is a block diagram depicting a resistive memory of an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a block diagram depicting a resistive memory of an embodiment of the invention. Referring to FIG. 1, the resistive memory 100 includes at least one memory cell MC, a source line control circuit 110, a current reference circuit 120, a bit line control circuit 130 and a word line control circuit 140. The memory cell MC is disposed at an intersection point between a bit line BL and a word line WL, and includes a transistor TC and a resistive element RC. The resistance of the resistive element RC is variable and changed by a write operation (such as the forming operation, the set operation, or the reset operation). A transition metal oxide layer can actualize the resistive element RC, and the embodiments of the invention are not limited thereto.

The first terminal of the resistive element RC is coupled to the bit line BL and the second terminal of the resistive element RC is coupled to a first terminal of the transistor TC. The second terminal of the transistor TC is coupled to the source line SL, and a control terminal of the transistor TC is coupled to the word line WL. The source line SL is coupled to the source line control circuit 110, the bit line BL is coupled to the bit line control circuit 130, and the word line WL is coupled to the word line control circuit 140. When the memory cell MC is selected, the word line control circuit 140 sends a word line signal to turn on the transistor TC. A pulse would be applied to the resistive element RC to perform a write operation or a read operation through the bit line BL, the source line SL, and the transistor TC.

The resistive memory 100 further includes a selection signal generating circuit 150. The source line control circuit 110 is also coupled to the current reference circuit 120, and the current reference circuit 120 is coupled to the selection signal generating circuit 150. The source line control circuit 110 may terminate the write operation after changing the resistance state of the memory cell MC. The selection signal generating circuit 150 outputs a selection signal to the current reference circuit 120 according to a target value of the resistance state of the memory cell MC. The current reference circuit 120 provides a reference voltage to the source line control circuit 110 according to the selection signal. Then the source line control circuit 110 compares the reference voltage and a source line voltage to determine whether to terminate the write operation.

The implementation details will be further explained below.

Figure 2:
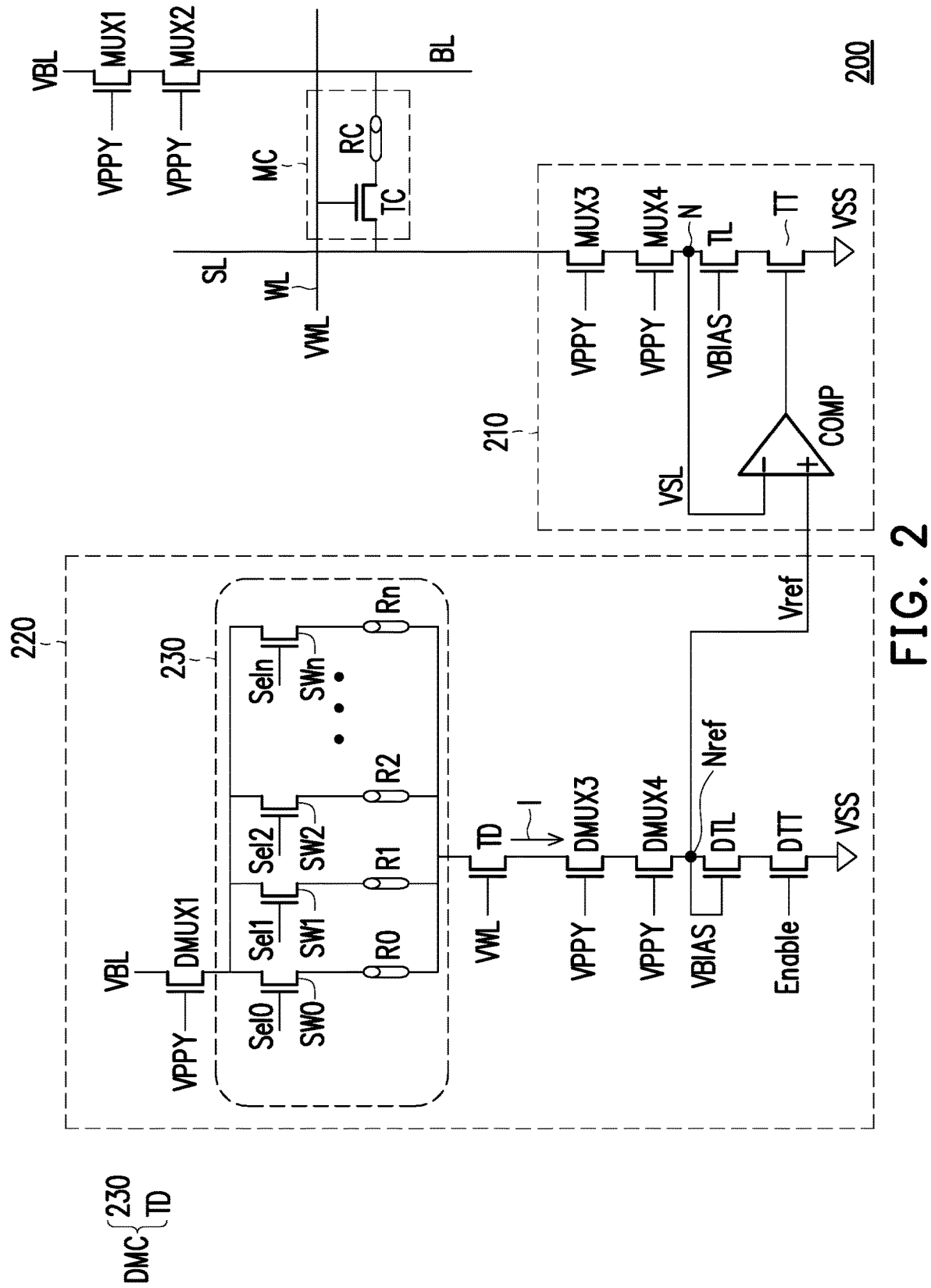
FIG. 2 is a schematic circuit diagram depicting a resistive memory of an embodiment of the invention.

FIG. 2 is a schematic circuit diagram depicting a resistive memory of an embodiment of the invention. Referring to FIG. 2, the resistive memory 100 is adapted to the circuit of the resistive memory 200. The transistors MUX1 and MUX2 are a part circuit of the bit line control circuit 130, and the transistors MUX3 and MUX4 are a part circuit of the source line control circuit 110. When the memory cell MC is selected during a write operation (herein a set operation), the word line WL receives a word line signal VWL to turn on the transistor TC. In addition, the transistors MUX1 to MUX4 are also turned on by an active signal VPPY; the bit line BL receives a bit line signal VBL and the source line SL is coupled to a ground terminal VSS. A write current would be applied to the memory cell MC. When the resistance of the resistive element RC changes, the current of the source line SL changes in response to the resistance. As the resistance of the resistive element RC gradually decreases, the current of the source line SL rises correspondingly.

The source line control circuit 110 further includes a current limiter TL, a termination switch TT and a comparator COMP. The current limiter TL is configured between the termination switch TT and the memory cell MC. The current limiter TL and the termination switch TT may be implemented by NMOS transistors, but the embodiments of the invention are not limited thereto.

In detail, the transistor MUX3 is coupled to the second terminal of the transistor TC and the first terminal of the transistor MUX4. The second terminal of the transistor MUX4 is coupled to a source line node N and the current limiter TL. An input terminal of the current limiter TL is coupled to the source line node N, and the output terminal of the current limiter TL is coupled to the termination switch TT.

The source line node N is configured on the source line SL and between the memory cell MC and the termination switch TT. The embodiments of the invention do not limit that the source line node N needs to be between the transistor MUX4 and the current limiter TL. The source line node N receives the current outputted from the memory cell MC to provide a source line voltage VSL. The source line voltage VSL is a voltage on the source line node N responses to the resistance of the resistive element RC. When the memory cell MC is in the HRS, the source line voltage VSL is in a low voltage state. By contrast, when the memory cell MC is in the LRS, the source line voltage VSL is in a high voltage state.

In the embodiment, the current limiter TL is configured between the termination switch TT and the source line node N and controlled by a bias voltage VBIAS. The current limiter TL is configured to control the current volume of the write current; thus, the write current, especially the set current, can be controlled to less than a saturation current value, avoiding the irreversible damage during the set operation.

The termination switch TT is coupled to the source line SL and configured between the current limiter TL and the ground terminal VSS. The termination switch TT could terminate the write operation performing on the memory cell MC according to a comparison result from the comparator COMP. The input terminals of the comparator COMP receives a reference voltage Vref from the current reference circuit 220 and the source line voltage VSL of the source line node N. The comparator COMP compares the source line voltage VSL with the reference voltage Vref to output the comparison result to a control terminal of the termination switch TT. When the source line voltage VSL is greater than the reference voltage Vref, the termination switch TT is turned off to terminate the write operation.

The current reference circuit 220 includes a variable resistance circuit 230 and a reference voltage node Nref. The variable resistance circuit 230 is configured to provide an effective resistance according to a target resistance of the resistive element RC and output a reference current I. In the embodiment, the write operation is a set operation, the target resistance of the resistive element RC is a target value of LRS of the memory cell MC, and the effective resistance is set to be equal to the target resistance.

The variable resistance circuit 230 includes a plurality of reference resistive elements R0~Rn and a plurality of selection switches SW0~SWn, wherein n is an integer. The reference resistive elements R0~Rn are electrically connected in a parallel configuration, and the selection switches SW0~SWn are coupled to the reference resistive elements R0~Rn, respectively. The selection switches SW0~SWn are selectively turned on to make the reference resistive elements R0~Rn form the effective resistance according to the selection signals Sel0~Seln. Referring to the description above, the selection signals Sel0~Seln may be provided by the selection signal generating circuit 150 and generated according to a target value of LRS or HRS of the memory cell MC. In other words, after the target value of LRS or HRS is predetermined, the variable resistance circuit 230 would selectively electrically connect one or more reference resistive elements among the reference resistive elements R0~Rn to provide the effective resistance and output the reference current correspondingly. In an embodiment, the resistances of the reference resistive elements R0~Rn are configured in a power of 2 relationships. For example, the resistance of the reference resistive element R0 is R, the resistance of the reference resistive element R1 is 2R, the resistance of the reference resistive element R2 is 4R.

More specifically, the current reference circuit 220 may be configured as a dummy memory cell array corresponding to the main memory cell array. The current reference circuit 220 further includes at least one dummy memory cell DMC, a dummy termination switch DTT and a dummy current limiter DTL. The dummy memory cell DMC is configured corresponding to the memory cell MC and includes the variable resistance circuit 230 and a dummy cell transistor TD. The dummy cell transistor TD is coupled to the variable resistance circuit 230 and outputs the reference current I to the reference voltage node Nref. It should be noted that the dummy memory cell DMC has the same electrical characteristics as the memory cell MC. It means that they have very similar performance and influence under the same environment, such as the PVT variation and the process corners. In an embodiment, the reference resistive elements R0~Rn and the resistive element RC are made by the same material, and the dummy cell transistor TD and the cell transistor TC are the same type transistors with the same structures; thus they own the same electrical characteristics.

In the embodiment, the current reference circuit 220 further includes transistor DMUX1, DMUX3 and DMUX4. The transistors DMUX1, DMUX3 and DMUX4 are configured corresponding to the transistors MUX1, MUX3 and MUX4 and also turned on by the active signal VPPY, in order to activate the dummy memory cell DMC as the memory cell MC is selected. For example, during the set operation performed on the memory cell MC with the bit line signal VBL, the dummy memory cell DMC is also applied by the bit line signal VBL at the same time.

The transistor DMUX3 is coupled to the second terminal of the dummy transistor TD and the first terminal of the transistor DMUX4. The second terminal of the transistor DMUX4 is coupled to the reference voltage node Nref and the dummy current limiter DTL. An input terminal of the dummy current limiter DTL is coupled to the reference voltage node Nref and the output terminal of the dummy current limiter DTL is coupled to the dummy termination switch DTT.

The reference voltage node Nref receives the reference current I outputted from the dummy memory cell DMC to provide the reference voltage Vref. It should be noted that the configuration position of the reference voltage node Nref in the circuit is very similar to that of the source line node N.

The dummy current limiter DTL is configured corresponding to the current limiter TL. The dummy termination switch DTT is configured corresponding to the termination switch TT. Herein, the dummy termination switch DTT and the dummy current limiter DTL are implemented by NMOS transistors. The dummy current limiter DTL has the same transistor structure with the current limiter TL, and the dummy termination switch DTT has the same transistor structure with the termination switch TT.

In an embodiment, the transistors of the current reference circuit 220 have the same electrical characteristics with the corresponding transistors of the source line control circuit 210. The influence, due to PVT factors or the process corners, of the dummy memory cell DMC is consistent with that of the memory cell MC. Therefore, the difference between the reference current and the current of the source line SL would be independent of PVT. The variation of the final resistance of the resistive element RC after the write operation is complete is decreased.

The dummy current limiter DTL is coupled between the dummy termination switch DTT and the dummy memory cell DMC, and controlled by the bias voltage VBIAS. The dummy termination switch DTT is coupled between the dummy current limiter DTL and the ground terminal VSS. More specifically, a first terminal of the dummy current limiter DTL is coupled to a control terminal of the dummy current limiter DTL and the reference voltage node Nref, a second terminal of the dummy current limiter DTL is coupled to a first terminal of the dummy termination switch DTT, a second terminal of the dummy termination switch DTT is coupled to the ground terminal VSS, and a control terminal of the dummy termination switch DTT receives an enable signal Enable.

Since the reference voltage node Nref also receives the bias voltage VBIAS, the comparator COMP compares the bias voltage VBIAS with the source line voltage VSL, that the control terminal of the current limiter TL also receives the bias voltage VBIAS.

In the present embodiment, the current reference circuit 220 could self-generate the reference current I without an external current source, thus the current reference circuit 220 and the source line control circuit 210 can be integrated into one chip. The resistive memory 200 can achieve an on-chip control function and minimizing the circuit size.

Figure 3:
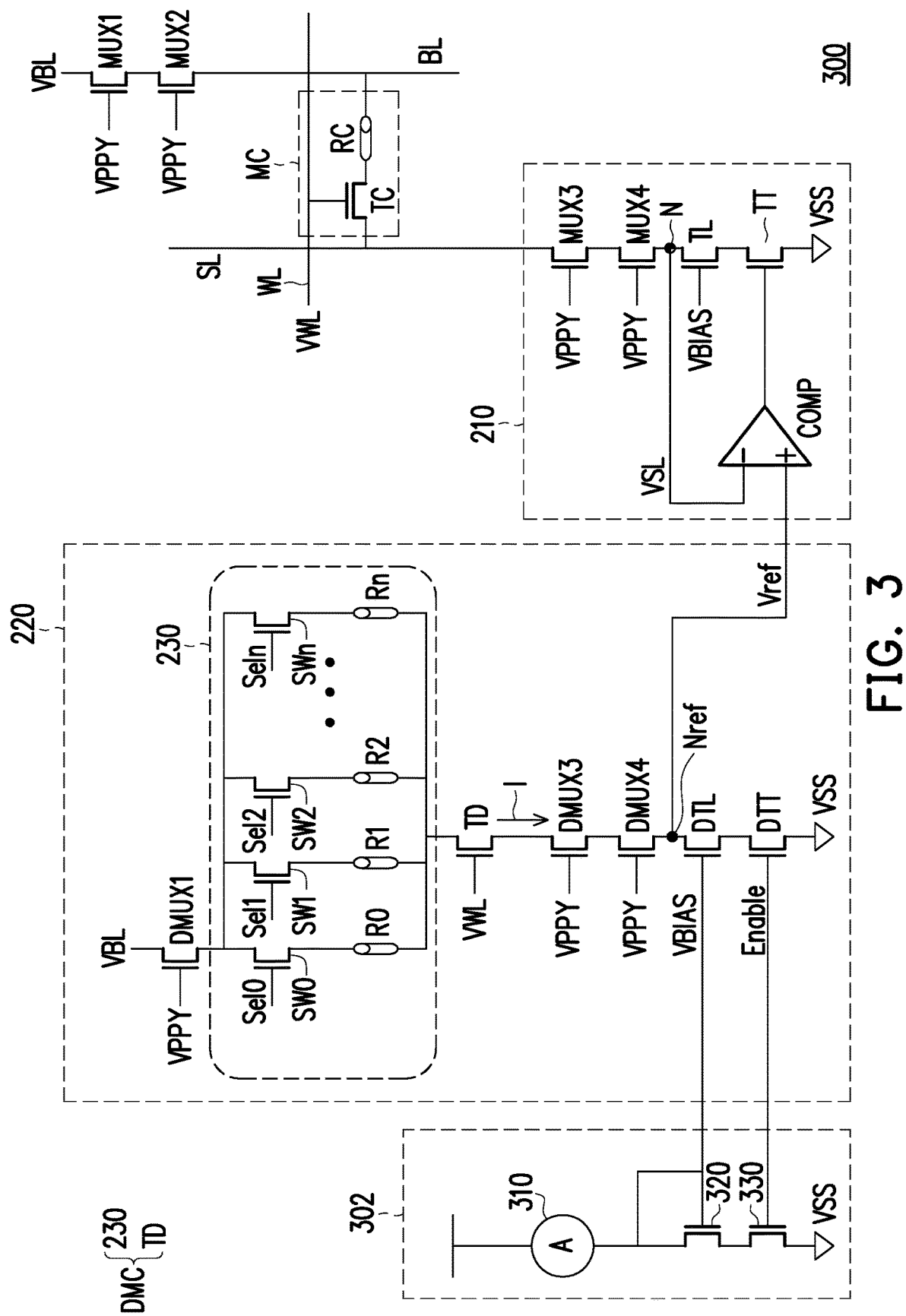
FIG. 3 is a schematic circuit diagram depicting a resistive memory of an embodiment of the invention.

FIG. 3 is a schematic circuit diagram depicting a resistive memory of an embodiment of the invention. Referring to FIG. 3, a circuit structure of a resistive memory 300 is very similar to that of the resistive memory 200 and also adapted to the resistive memory 100. The difference between the resistive memory 200 and the resistive memory 300 is that the resistive memory 300 includes an external source device 302. The control terminal of the dummy current limiter DTL is coupled to the external source device 302 but not coupled to the reference voltage node Nref. In the embodiment, reference voltage Vref would not be necessarily the bias voltage VBIAS.

Specifically, the dummy current limiter DTL and the dummy termination switch DTT are transistors, a first terminal of the dummy current limiter DTL is coupled to the reference voltage node Nref, a second terminal of the dummy current limiter DTL is coupled to a first terminal of the dummy termination switch DTT, a control terminal of the dummy current limiter DTL is coupled to the external source device 302 to receive the bias voltage VBIAS, a second terminal of the dummy termination switch DTT is coupled to a ground terminal VSS, and a control terminal of the dummy termination switch DTT receives an enable signal Enable.

In the embodiment, the external source device 302 includes a current source 310, a transistor 320 and a transistor 330, but the embodiments of the invention are not limited thereto. The transistor 320 is a load element and coupled between the current source 310 and the transistor 330. The transistor 330 is coupled between the transistor 320 and the ground terminal VSS. The current reference circuit 220 and the source line control circuit 210 can still be integrated into one chip.

Since operations of the resistive memory 300 are equivalent to the operations of the resistive memory 200, the related description is omitted hereinafter.

Figure 4:
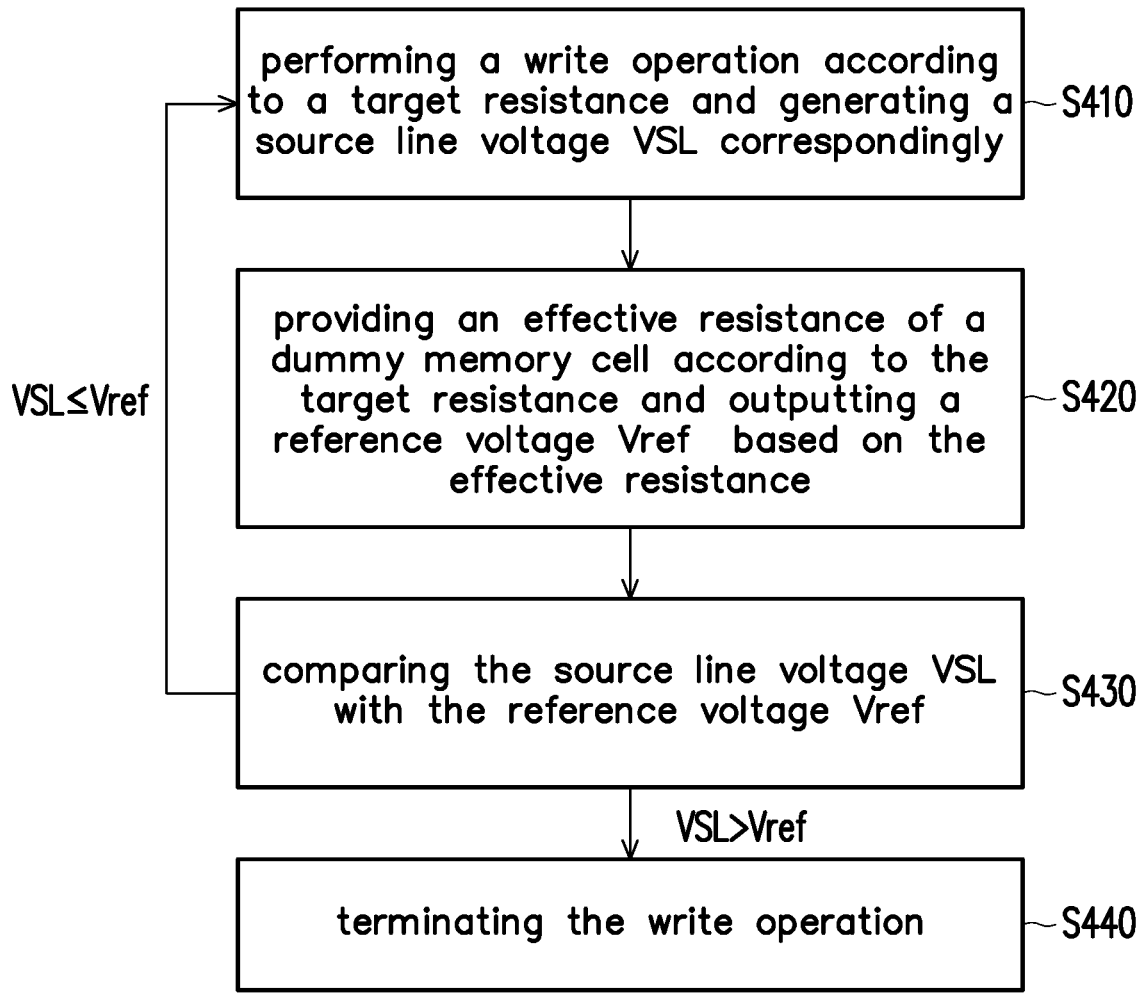
FIG. 4 is a flowchart of a self-termination control method for a resistive memory according to an embodiment of the invention.

FIG. 4 is a flowchart of a self-termination control method for a resistive memory according to an embodiment of the invention. Referring to FIG. 4, the self-termination control method of FIG. 4 is adapted to embodiments of FIG. 1 through FIG. 3.

In step S410, a write operation is performed on a selected memory cell of a resistive memory according to a target resistance of a resistive element of the selected memory cell and a source line voltage VSL is generated correspondingly. The magnitude of the source line voltage VSL would respond to the resistance of the resistive element.

In step S420, an effective resistance of a dummy memory cell according to the target resistance is provided, and a reference voltage Vref is outputted based on the effective resistance, wherein the dummy memory cell is configured corresponding to the selected memory cell.

In step S430, the source line voltage VSL is compared with the reference voltage Vref to generate a comparison result. When the source line voltage VSL is greater than the reference voltage Vref, execute step S440 and when the source line voltage VSL is less than or equal to the reference voltage Vref, return to the step S410.

Each step of FIG. 4 has been described in the embodiments of FIG. 1 to FIG. 3 and will not be repeated hereinafter.

In summary, the resistive memory of the invention includes at least one memory cell and at least one dummy memory cell corresponding to the at least one memory cell. The memory cell includes a cell transistor and a resistive element, and the dummy memory cell includes a variable resistance circuit and a dummy cell transistor. The dummy cell transistor and the cell transistor have the same electrical characteristics, and the variable resistance circuit could provide an effective resistance based on the target resistance of the resistive element. The current outputted from the dummy memory cell provides a reference voltage, and the current outputted from the memory cell provides a source line voltage. The write operation would be self-terminated based on a comparison result of the source line voltage and the reference voltage. The termination mechanism would be independent of PVT factors and the process corners.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A resistive memory with a self-termination control function, comprising:
    at least one memory cell, coupled to a bit line and a source line and comprising a cell transistor and a resistive element, wherein a resistance of the resistive element is changed during a write operation;
    a source line control circuit, comprising:
        a termination switch, coupled to the source line and terminating the write operation performing on the at least one memory cell according to a comparison result; and
        a comparator, comparing a voltage of a source line node with a reference voltage to output the comparison result, wherein the source line node is on the source line and between the at least one memory cell and the termination switch, and the voltage of the source line node responses to the resistance of the resistive element; and
    a current reference circuit, comprising:
        a variable resistance circuit, comprising a plurality of reference resistive elements, providing an effective resistance according to a target resistance of the resistive element and outputting a reference current; and
        a reference voltage node, coupled to the variable resistance circuit and the comparator, and receiving the reference current to provide the reference voltage to the comparator.

2. The resistive memory according to claim 1, wherein the write operation is a set operation, the target resistance of the resistive element is a target value of a low resistance state of the at least one memory cell, and the effective resistance is equal to the target resistance.

3. The resistive memory according to claim 1, wherein the plurality of reference resistive elements are electrically connected in a parallel configuration, and the variable resistance circuit further comprising:
    a plurality of selection switches, coupled to the plurality of reference resistive elements, respectively, wherein the plurality of selection switches are selectively turned on to make the plurality of reference resistive elements form the effective resistance.

4. The resistive memory according to claim 3, wherein the resistances of the plurality of the reference resistive elements are configured in a power of 2 relationships.

5. The resistive memory according to claim 1, wherein the source line control circuit comprising:
    a current limiter, configured between the termination switch and the at least one memory cell and controlled by a bias voltage, wherein an input terminal of the current limiter is coupled to the source line node.

6. The resistive memory according to claim 5, wherein the current reference circuit further comprises:
    a dummy memory cell, configured corresponding to the at least one memory cell and comprising the variable resistance circuit and a dummy cell transistor, wherein the dummy cell transistor is coupled to the variable resistance circuit and outputs the reference current;
    a dummy termination switch, coupled to the dummy memory cell and configured corresponding to the termination switch; and
    a dummy current limiter, coupled between the dummy termination switch and the dummy memory cell and configured corresponding to the current limiter, wherein the reference voltage node is coupled to an input terminal of the dummy current limiter.

7. The resistive memory according to claim 6, wherein the current reference circuit and the source line control circuit are integrated into one chip.

8. The resistive memory according to claim 7, wherein the dummy current limiter and the dummy termination switch are transistors, a first terminal of the dummy current limiter is coupled to a control terminal of the dummy current limiter and the reference voltage node, a second terminal of the dummy current limiter is coupled to a first terminal of the dummy termination switch, a second terminal of the dummy termination switch is coupled to a ground terminal, and a control terminal of the dummy termination switch receives an enable signal.

9. The resistive memory according to claim 7, wherein the dummy current limiter and the dummy termination switch are transistors, a first terminal of the dummy current limiter is coupled to the reference voltage node, a second terminal of the dummy current limiter is coupled to a first terminal of the dummy termination switch, a control terminal of the dummy current limiter is coupled to an external source device to receive the bias voltage, a second terminal of the dummy termination switch is coupled to a ground terminal, and a control terminal of the dummy termination switch receives an enable signal.

10. The resistive memory according to claim 6, wherein the transistors of the current reference circuit have the same electrical characteristics with the corresponding transistors of the source line control circuit.

11. A self-termination control method for a resistive memory, comprising:
    performing a write operation on a selected memory cell of the resistive memory according to a target resistance of a resistive element of the selected memory cell and generating a source line voltage correspondingly;
    providing an effective resistance of a dummy memory cell according to the target resistance based on a plurality of reference resistive elements and outputting a reference voltage based on the effective resistance, wherein the dummy memory cell is configured corresponding to the selected memory cell;

comparing the source line voltage with the reference voltage to generate a comparison result; and terminating the write operation according to the comparison result.

12. The self-termination control method according to claim 11, wherein the write operation is a set operation, the target resistance of the resistive element is a target value of a low resistance state of the selected memory cell, and the effective resistance is equal to the target resistance.

13. The self-termination control method according to claim 11, wherein the step of providing the effective resistance of the dummy memory cell according to the target resistance comprises:

selectively turning on a plurality of selection switches to make the plurality of reference resistive elements electrically connected in a parallel configuration form the effective resistance.

14. The self-termination control method according to claim 13, wherein the resistances of the plurality of the reference resistive elements are configured in a power of 2 relationships.

15. The self-termination control method according to claim 11, wherein a transistor of the selected memory cell has the same electrical characteristics with a transistor of the dummy memory cell.

* * * * *